(12) United States Patent
Francis et al.

(10) Patent No.: US 11,404,300 B2
(45) Date of Patent: Aug. 2, 2022

(54) MOUNTING OF SEMICONDUCTOR-ON-DIAMOND WAFERS FOR DEVICE PROCESSING

(71) Applicant: RFHIC Corporation, Anyang (KR)

(72) Inventors: Daniel Francis, Oxfordshire (GB); Frank Yantis Lowe, Oxfordshire (GB); Michael Ian Pearson, Oxfordshire (GB)

(*) Notice: Subject to any disclaimer, the term of this patent is extended or adjusted under 35 U.S.C. 154(b) by 225 days.

(21) Appl. No.: 16/830,298

(22) Filed: Mar. 26, 2020

(65) Prior Publication Data
US 2020/0227301 A1 Jul. 16, 2020

Related U.S. Application Data

(62) Division of application No. 15/770,209, filed as application No. PCT/US2016/061436 on Nov. 10, 2016, now abandoned.

(Continued)

(51) Int. Cl.
*H01L 21/00* (2006.01)
*H01L 21/683* (2006.01)
(Continued)

(52) U.S. Cl.
CPC .... *H01L 21/6835* (2013.01); *H01L 21/02002* (2013.01); *H01L 21/2007* (2013.01); *H01L 29/1602* (2013.01); *H01L 2221/68381* (2013.01)

(58) Field of Classification Search
CPC .......... H01L 21/6835; H01L 21/02002; H01L 21/683; H01L 21/20; H01L 29/1602
See application file for complete search history.

(56) References Cited

U.S. PATENT DOCUMENTS 9,029,269 B2 * 5/2015 Bourbina ................ B32B 33/00
438/455
9,159,595 B2 * 10/2015 Hurley .............. H01L 21/67092
(Continued)

FOREIGN PATENT DOCUMENTS

JP 1999145437 A 5/1999
JP 2010251978 A 11/2010
(Continued)

*Primary Examiner* — Mounir S Amer
*Assistant Examiner* — Alexander Belousov
(74) *Attorney, Agent, or Firm* — Patent Office of Dr. Chung Park

(57) ABSTRACT

The present invention discloses a semiconductor-on-diamond-on-carrier substrate wafer. The semiconductor-on-diamond-on-carrier wafer comprises: a semiconductor-on-diamond wafer having a diamond side and semiconductor side; a carrier substrate disposed on the diamond side of the semiconductor-on-diamond wafer and including at least one layer having a lower coefficient of thermal expansion (CTE) than diamond; and an adhesive layer disposed between the diamond side of the semiconductor-on-diamond wafer and the carrier substrate to bond the carrier substrate to the semiconductor-on-diamond wafer. The semiconductor-on-diamond-on-carrier substrate wafer has the following characteristics: a total thickness variation of no more than 40 μm; a wafer bow of no more than 100 μm; and a wafer warp of no more than 40 μm.

16 Claims, 5 Drawing Sheets

Related U.S. Application Data

(60) Provisional application No. 62/257,786, filed on Nov. 20, 2015.

(51) Int. Cl.
  *H01L 21/20* (2006.01)
  *H01L 21/02* (2006.01)
  *H01L 29/16* (2006.01)

(56) References Cited

U.S. PATENT DOCUMENTS

| | | | |
|---|---|---|---|
| 9,412,706 B1* | 8/2016 | Abdelnaby | H01L 21/304 |
| 10,074,816 B2* | 9/2018 | Huang | H01L 51/0097 |
| 10,103,048 B2* | 10/2018 | Flaim | B32B 37/30 |
| 2005/0090076 A1* | 4/2005 | Barsky | H01L 21/6836 |
| | | | 438/464 |
| 2011/0198817 A1* | 8/2011 | Hurley | H01L 21/67144 |
| | | | 279/3 |
| 2012/0168773 A1* | 7/2012 | Sung | H01L 23/3732 |
| | | | 438/105 |
| 2012/0273775 A1* | 11/2012 | Sung | H01L 21/02425 |
| | | | 438/105 |
| 2013/0298823 A1* | 11/2013 | Francis | H01L 21/02658 |
| | | | 117/86 |
| 2014/0057450 A1* | 2/2014 | Bourbina | H01L 21/6835 |
| | | | 438/759 |
| 2014/0110722 A1* | 4/2014 | Kub | H01L 29/7787 |
| | | | 257/77 |
| 2014/0217443 A1* | 8/2014 | Heikman | H01L 33/44 |
| | | | 438/27 |
| 2015/0064385 A1* | 3/2015 | Flaim | B32B 37/30 |
| | | | 156/247 |
| 2015/0200254 A1* | 7/2015 | Diduck | H01L 23/3732 |
| | | | 428/141 |
| 2016/0181553 A1* | 6/2016 | Huang | B32B 27/08 |
| | | | 264/494 |
| 2016/0225723 A1* | 8/2016 | Abdelnaby | H01L 24/00 |

FOREIGN PATENT DOCUMENTS

| | | |
|---|---|---|
| JP | 2013236016 A | 11/2013 |
| JP | 2015522213 A | 8/2015 |

\* cited by examiner

MOUNTING OF SEMICONDUCTOR-ON-DIAMOND WAFERS FOR DEVICE PROCESSING

CROSS-REFERENCE TO PRIOR APPLICATIONS

This application is a divisional application of U.S. patent application Ser. No. 15/770,209, filed on Apr. 22, 2018, which is a national Stage Patent Application of PCT International Patent Application No. PCT/US2016/061436, filed on Nov. 10, 2016 under 35 U.S.C. § 371, which claims priority of U.S. Patent Application No. 62/257,786, filed on Nov. 20, 2015, which are all hereby incorporated by reference in their entirety.

FIELD OF INVENTION

The present invention relates to a method of mounting a semiconductor-on-diamond wafer on a carrier substrate for subsequent semiconductor device fabrication on the semiconductor-on-diamond wafer. The present invention also relates to a semiconductor-on-diamond-on-carrier substrate wafer fabricated using the methodology described herein and to a method of fabricating one or more semiconductor device structures on a semiconductor side of such a semiconductor-on-diamond-on-carrier substrate wafer.

BACKGROUND OF INVENTION

Semiconductor-on-diamond wafers such as GaN-on-diamond wafers are known in the art. For example, U.S. Pat. Nos. 7,595,507, 8,283,189, and 8,283,672 disclose GaN-on-diamond wafers and methods of manufacture.

In order to fabricate semiconductor devices on GaN-on-diamond wafers, the GaN-on-diamond wafers need to meet certain mechanical specifications. Currently, free standing GaN-on-diamond wafers do not meet many of these specifications. In order to meet these specifications, it has been proposed to mount the GaN-on-diamond wafer on a carrier substrate. The carrier mounting process is non-trivial because the mounted GaN-on-diamond wafer must meet all mechanical specifications and simultaneously remain unchanged when exposed to acids, bases, solvents and heat treatments, yet be simply dismountable at the end of the device fabrication process.

WO2014006562 describes a method of mount a semiconductor-on-diamond wafer on a carrier substrate for subsequent semiconductor device fabrication on the mounted semiconductor-on-diamond wafer. The semiconductor-on-diamond wafer is bonded to a flat carrier plate, which is described as being advantageously a diamond carrier plate, to eliminate bow in the semiconductor-on-diamond wafer. Semiconductor device structures can then be fabricated on the mounted wafer. The carrier plate can then be removed and re-used. One problem with this approach is that the diamond carrier substrate is expensive and the bonding process can be time consuming.

US20020115263 discloses a method of bonding a substrate to a carrier using a non-silicate glass bonding layer. The bonding comprises heating the substrate, bonding layer, and carrier to bond the carrier to the substrate. The bonding layer is substantially unsusceptible to outgassing in ultra-high vacuum environments and is impervious to substantial chemical and structural degradation during thermal processing at temperatures at least up to about 500° C. However, one problem with this approach is that if there is a mismatch in coefficient of thermal expansion (CTE) between the substrate and the carrier then the heating process can lead to thermally induced stress and wafer bowing.

It is an aim of the present invention to provide a method of mounting a semiconductor-on-diamond wafer to a carrier substrate which is relatively cheap and fast and which results in a highly flat semiconductor-on-diamond-on-carrier wafer which has a highly uniform thickness.

SUMMARY OF INVENTION

The present specification provides a method of mounting a semiconductor-on-diamond wafer on a carrier substrate for subsequent semiconductor device fabrication on the semiconductor-on-diamond wafer, the method comprising:

pressing a semiconductor side of the semiconductor-on-diamond wafer against an optical flat to provide front justification of the semiconductor-on-diamond wafer;

bonding the carrier substrate to a diamond side of the semiconductor-on-diamond wafer while the semiconductor-on-diamond wafer is pressed against the optical flat to provide a bonded semiconductor-on-diamond-on-carrier substrate wafer; and removing the bonded semiconductor-on-diamond-on-carrier substrate wafer from the optical flat to expose the semiconductor side of the bonded semiconductor-on-diamond-on-carrier substrate wafer, wherein the carrier substrate comprises at least one layer having a lower coefficient of thermal expansion (CTE) than diamond, wherein an adhesive is used for bonding the carrier substrate to the semiconductor-on-diamond wafer and bonding is achieved by curing the adhesive while the semiconductor-on-diamond wafer is pressed against the optical flat, and wherein after removal of the bonded semiconductor-on-diamond-on-carrier substrate wafer from the optical flat the bonded semiconductor-on-diamond-on-carrier substrate wafer has the following characteristics:

a total thickness variation of no more than 40 μm, and more preferably no more than 30 μm, 20 μm, or 10 μm;

a wafer bow of no more than 100 μm, and more preferably no more than 80 μm, 60 μm, 40 μm or 20 μm;

a wafer warp of no more than 40 μm, and more preferably no more than 20 μm.

The method provides a semiconductor-on-diamond-on-carrier substrate wafer comprising:

a semiconductor-on-diamond wafer; and a carrier substrate bonded to a diamond side of the semiconductor-on-diamond wafer, wherein the carrier substrate comprises at least one layer having a lower coefficient of thermal expansion (CTE) than diamond, wherein the carrier substrate is bonded to the diamond side of the semiconductor-on-diamond wafer with an adhesive, and wherein the bonded semiconductor-on-diamond-on-carrier substrate wafer has the following characteristics:

a total thickness variation of no more than 40 μm, and more preferably no more than 30 μm, 20 μm, or 10 μm;

a wafer bow of no more than 100 μm, and more preferably no more than 80 μm 60 μm, 40 μm or 20 μm;

a wafer warp of no more than 40 μm, and more preferably no more than 20 μm.

According to certain embodiments, the carrier substrate may comprise a layer having a higher coefficient of thermal expansion (CTE) than diamond (e.g. silicon) in addition to the layer having a lower coefficient of thermal expansion (CTE) than diamond (e.g. quartz). The thermal expansion coefficient of the layers and layer thicknesses of the carrier substrate can be tuned such that internal residual stresses ensure near zero bow of the semiconductor-on-diamond-on-carrier substrate wafer. Such a mounted semiconductor-on-diamond is therefore suitable for device manufacture on a standard fabrication line. After device fabrication, the carrier substrate may be released and reused. As such, also provided is a method of fabricating semiconductor device structures, the method comprising:

fabricating one or more semiconductor device structures on a semiconductor side of a semiconductor-on-diamond-on-carrier substrate wafer formed according the methodology as described herein while maintaining the semiconductor-on-diamond-on-carrier substrate wafer at a device fabrication temperature at which bonding of the carrier substrate and semiconductor-on-diamond wafer is maintained; and then releasing the carrier substrate from the semiconductor-on-diamond wafer after fabrication of the one or more semiconductor device structures by heating the semiconductor-on-diamond-on-carrier substrate wafer to a temperature in excess of the device fabrication temperature such that bonding of the carrier substrate and semiconductor-on-diamond wafer is broken.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1:
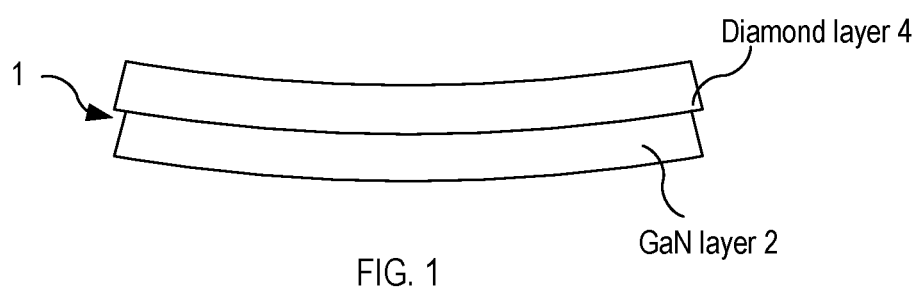
FIG. 1 shows a free-standing GaN-on-Diamond wafer exhibiting wafer bow.

One skilled in the art shall recognize: (1) that certain steps may optionally be performed; (2) that steps may not be limited to the specific order set forth herein; and (3) that certain steps may be performed in different orders, including being done contemporaneously.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. The appearances of the phrases "in one embodiment," "in an embodiment," or "in embodiments" in various places in the specification are not necessarily all referring to the same embodiment or embodiments.

The mounting of a semiconductor-on-diamond wafer to a carrier substrate in order to meet strict mechanical and geometric requirements for subsequent semiconductor device processing has been found to be a surprising difficult problem. (Hereinafter, the terms GaN-on-diamond wafer and semiconductor-on-diamond wafer are used interchangeably. Also, semiconductor-on-diamond wafer includes a diamond layer and a semiconductor layer, and GaN is one type of semiconductor material.) Several groups over several years have worked on this problem without achieving a satisfactory commercially viable solution. The present specification describes an approach which has finally been optimized to provide such a commercially viable solution to this problem. Such a semiconductor-on-diamond wafer mounting solution is required for commercial semiconductor device manufacture on such wafers, particular when the semiconductor-on-diamond wafers are relatively thin (e.g. less than 200 μm thickness). As such, this methodology is commercially enabling and can be used by semiconductor device manufacturers to successfully process their devices onto a semiconductor-on-diamond substrate wafer without significant modification to their fabrication lines.

As defined in the summary of invention section, the basic methodology for mounting a semiconductor-on-diamond wafer (e.g. GaN-on-Diamond) on a carrier substrate for subsequent semiconductor device fabrication on the semiconductor-on-diamond wafer comprises:

pressing a semiconductor side of the semiconductor-on-diamond wafer against an optical flat to provide front justification of the semiconductor-on-diamond wafer (optionally pressing using a further optical flat and also using one or more spacers positioned between the optical flats in order to control the thickness of the semiconductor-on-diamond-on-carrier substrate wafer);

bonding the carrier substrate to a diamond side of the semiconductor-on-diamond wafer while the semiconductor-on-diamond wafer is pressed against the optical flat to provide a bonded semiconductor-on-diamond-on-carrier substrate wafer; and removing the bonded semiconductor-on-diamond-on-carrier substrate wafer from the optical flat to expose the semiconductor side of the bonded semiconductor-on-diamond-on-carrier substrate wafer, wherein the carrier substrate comprises at least one layer having a lower coefficient of thermal expansion (CTE) than diamond, wherein an adhesive is used for bonding the carrier substrate to the semiconductor-on-diamond wafer and bonding is achieved by curing the adhesive while the semiconductor-on-diamond wafer is pressed against the optical flat, and wherein after removal of the bonded semiconductor-on-diamond-on-carrier substrate wafer from the optical flat the bonded semiconductor-on-diamond-on-carrier substrate wafer has the following characteristics:

a total thickness variation of no more than 40 µm, and more preferably no more than 30 µm, 20 µm, or 10 µm;

a wafer bow of no more than 100 µm, and more preferably no more than 80 µm, 60 µm, 40 µm or 20 µm;

a wafer warp of no more than 40 µm, and more preferably no more than 20 µm.

In embodiments, one approach uses the combination of a number of interrelated features including front justification, the use of a carrier substrate with a CTE close to, but lower than, diamond, and the use of a low temperature adhesive. A temperature during bonding can be maintained between 10° C. and 40° C. using a low temperature adhesive such as a UV glue which bonds at room temperature when exposed to UV light and the bonding process comprises exposure to UV light to bond the carrier substrate to the diamond side of the semiconductor-on-diamond wafer. The carrier substrate may be formed of a layer of quartz. By bonding the quartz to the diamond without significant heating, the thermally induced bowing due to CTE mismatch between the quartz and diamond can be reduced.

The mounted wafer should also be capable of withstanding the processing steps utilized in fabricating semiconductor devices on such a wafer and advantageously the carrier wafer should be subsequently readily removable and recyclable. For example, a thermal release adhesive can be provided between the carrier substrate and the diamond side of the semiconductor-on-diamond wafer to allow release of the carrier substrate after use. In this regard, the adhesive should be capable of maintaining adhesion of the carrier substrate and semiconductor-on-diamond wafer during exposure to device fabrication temperatures which may be equal to or greater than 200° C., 220° C., 250° C., 280° C., 300° C., or 350° C. depending on the specific device fabrication process. After device fabrication the thermal release adhesive can be exposed to higher temperatures (e.g. in excess of 220° C., 250° C., 280° C., 300° C., 350° C., or 400° C.) to enable the carrier substrate to be removed and re-used after semiconductor device fabrication on the semiconductor-on-diamond wafer. As such, in embodiments, the method of device manufacture may comprise: fabricating one or more semiconductor device structures on a semiconductor side of a semiconductor-on-diamond-on-carrier substrate wafer as described herein while maintaining the semiconductor-on-diamond-on-carrier substrate wafer at a temperature less than 220° C. (or 220° C., 250° C., 280° C., 300° C., 350° C., or 400° C. depending on the release temperature of the thermal release adhesive); and releasing the carrier substrate from the semiconductor-on-diamond wafer after fabrication of the one or more semiconductor device structures by heating the semiconductor-on-diamond-on-carrier substrate wafer to a temperature in excess of 220° C. (or 250° C., 280° C., 300° C., 350° C., or 400° C. depending on the release temperature of the thermal release adhesive).

FIG. 1 shows a free-standing GaN-on-diamond wafer comprising a layer of GaN 2 attached to a diamond layer 4. Such a free-standing GaN-on-diamond wafer 1 is bowed in the manner illustrated with the exposed surface of the GaN in convex form.

Figure 2:
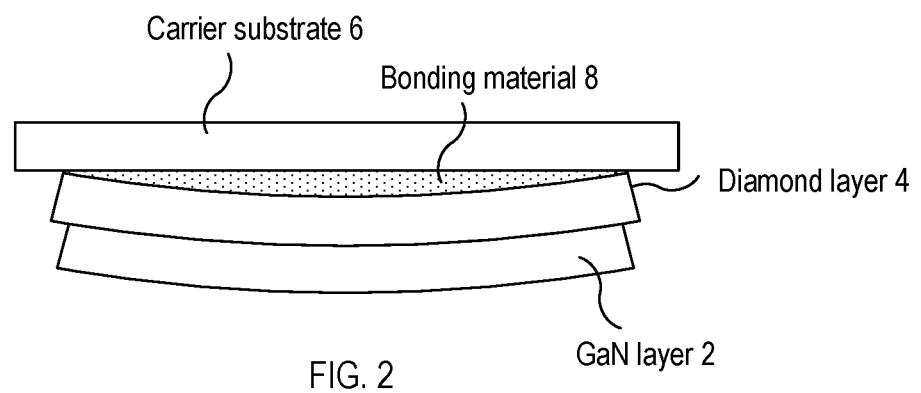
FIG. 2 shows a GaN-on-Diamond wafer bonded to a carrier wafer but still exhibiting wafer bow.

With reference to FIG. 2, if a carrier substrate 6 is bonded to the diamond side of such a bowed GaN-on-diamond wafer 1 using a bonding material 8 such as an epoxy resin, glass, or a ceramic adhesive, the adhesive 8 tends to fill the concave form of the diamond side of the GaN-on-diamond wafer 1 such that the convex bowing of the exposed GaN surface of the wafer 1 remains. Experiments show that it is possible to get down towards a 40 µm warp, but rarely better, this being due largely to the internal stress within the diamond layer.

Figure 3A:
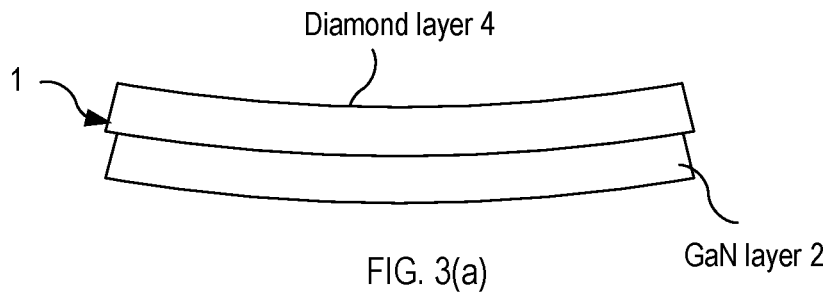
FIGS. 3(a) to 3(c) show the steps involved in mounting a GaN-on-Diamond wafer bonded to a carrier wafer in order to eliminate wafer bow including starting with a free-standing GaN-on-Diamond wafer exhibiting wafer bow (FIG. 3(a)), front-justification of the GaN-on-Diamond wafer against an optical flat (FIG. 3(b)), and bonding of a carrier wafer to the GaN-on-diamond wafer using a UV adhesive and a carrier wafer having a CTE lower than diamond (FIG. 3(c)) according to embodiments of the present invention.
Figure 3B:
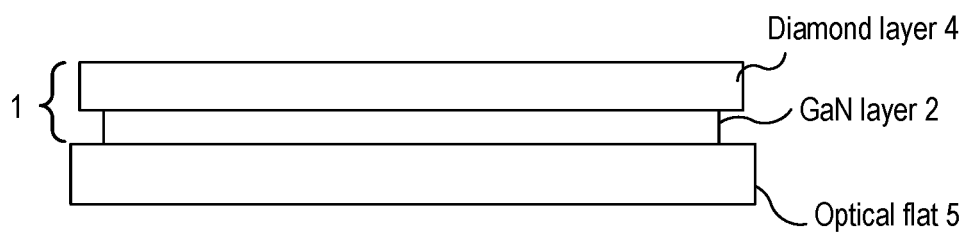
Figure 3C:
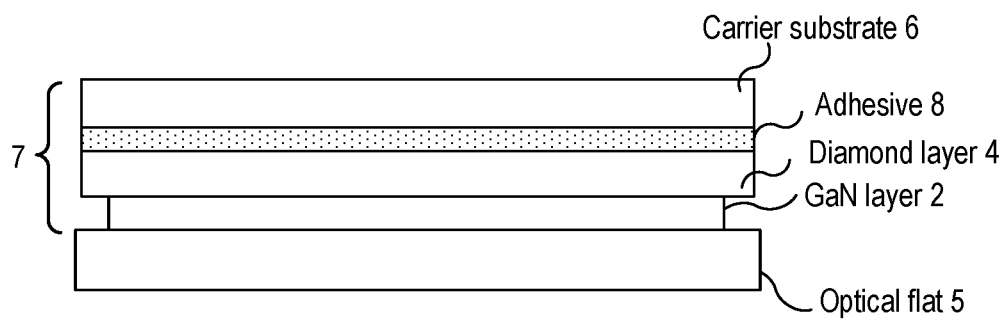

In light of the above, it has been found that front justification of the GaN-on-diamond wafer is required. This is illustrated in FIGS. 3(a) to 3(c). FIG. 3(a) shows a typical bowed free-standing GaN-on-diamond wafer 1 as previously shown in FIG. 1 comprising a layer of GaN 2 attached to a diamond layer 4. In embodiments, the diamond layer 4 may be deposited on the GaN layer 2 by a suitable diamond deposition technique.

As shown in FIG. 3(b), the GaN side of the GaN-on-diamond wafer 1 is pressed flat onto an optical flat 5. A carrier substrate 6 may then be bonded to the diamond side of the GaN-on-diamond wafer via an adhesive 8 while the GaN-on-diamond wafer 1 is pressed against the optical flat 5. More specifically, as discussed in conjunction with FIG. 3(c), the stack of layers including GaN layer 2, diamond layer 4, adhesive 8 and carrier substrate 6 are pressed against the top surface of the optical flat 5 while the adhesive 8 is cured to secure the diamond layer 4 to the carrier wafer 6.

Once the carrier substrate 6 is adhered to GaN-on-diamond wafer 1 by the adhesive 8, the GaN-on-diamond-on-carrier substrate wafer 7 can be removed from the optical flat 5 with the GaN surface retaining the flatness characteristics of the optical flat 5. That is, the optical flat 5 determines the shape of the wafer post bonding to the carrier substrate 6.

Figure 3D:
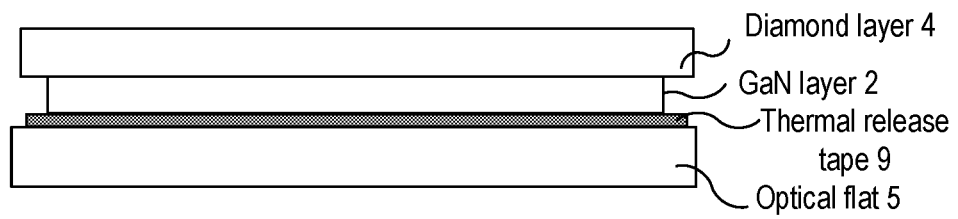
FIG. 3(d) shows an optional step of disposing a thermal tape on the optical flat according to embodiments of the present invention.

FIG. 3(d) shows an optional step of using a thermal release tape (or, shortly, thermal tape) 9 according to embodiments of the present invention. While FIGS. 3(a) to 3(c) illustrate the bottom surface of the GaN layer 2 being pressed directly against the optical flat 5, it has been found that the provision of a thermal release tape 9 can be applied to the top surface of the optical flat 5 such that the GaN-on-diamond wafer 1 is held in place during the carrier substrate bonding process to ensure that the bonded wafer retains the profile of the optical flat 5. The bonded wafer can then be removed from the optical flat 5 after bonding is completed by applying heating to trigger release of the thermal release tape 9.

In embodiments, the above described process as illustrated in FIGS. 3(a) to 3(c) may produce a mounted GaN-on-diamond wafer with the desired levels of flatness and thickness uniformity. In embodiments, further features may be added to ensure that the mounted semiconductor-on-diamond wafer meets the strict mechanical and geometric requirements for semiconductor device fabrication lines.

Many types of bonding which are sufficiently robust to hold the GaN-on-diamond wafer 1 flat on a carrier substrate 6 during semiconductor device processing require heating. However, if a non-diamond material is used for the carrier substrate 6, there will inevitably be a mismatch in the CTE of the carrier substrate 6 and the diamond of the diamond layer 4. It has been found that when bonding materials which require heating are utilized, such as glass bonding, the thermal mismatch between the carrier substrate 6 and the diamond can lead to stress build up on cooling and subsequent bowing or cracking. As such, in embodiments, a low temperature (e.g. room temperature) adhesive may be used in certain configurations. Suitable adhesives include UV glues which set under exposure to UV light. However, in embodiments, any glue which sets at or near room temperature without outgassing could potentially be utilized. UV glue is preferable because the diamond layer 4 and carrier wafer 6 can be mounted to the desired configuration first with the adhesive 8 in un-set form and then subsequently exposed to UV to set the adhesive in a relatively short time frame.

Typical low cost materials for carrier substrate 6 include glass, silicon, and quartz, the most expensive of which is quartz. Quartz has a lower CTE than diamond. Given that the UV glue dismount is done at a high temperature and that many process steps are performed at temperatures higher than room temperature, it is necessary that the diamond be stable and solid at elevated temperatures. Mounting on silicon or glass leaves the diamond in tension at high temperatures, causing it to break above 200° C. Mounting on quartz leaves the diamond under compression at elevated temperatures. Under compression, the diamond causes the quartz to bend and ultimately the UV glue to release without cracking. Since crack-free release is the objective, a substrate with CTE lower than diamond has been found to be necessary.

Figure 4:
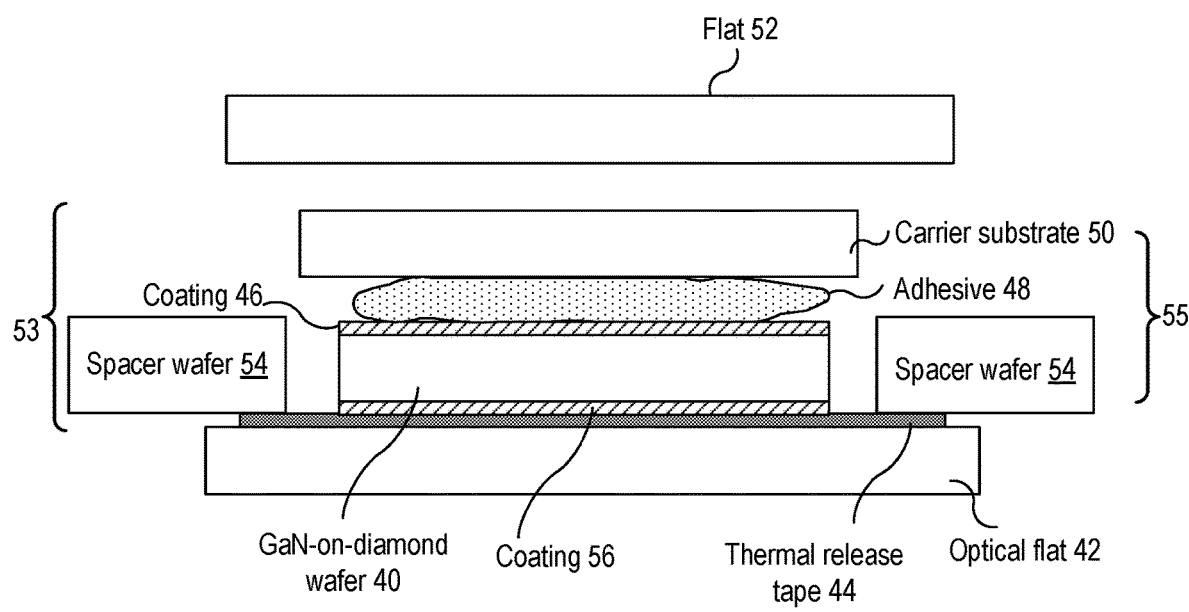
FIG. 4 illustrates a suitable mounting configuration for bonding a carrier wafer to a GaN-on-diamond wafer according to embodiments of the present invention.

FIG. 4 illustrates a suitable mounting configuration in accordance with embodiments of the present invention. In embodiments, a GaN-on-diamond wafer 40 is pressed and adhered to optical flat quartz 42 using thermal release tape 44. Optionally a protective coating 56 (e.g. SiN) can be provided on the layer of GaN of the GaN-on-diamond wafer 40. In embodiments, the protective coating 56 may be applied to the GaN side of the GaN-on-diamond wafer 40 before the GaN-on-diamond wafer 40 is disposed on the optical flat 42 for bonding. The optical flat 42 may be separated (released) from the GaN-on-diamond wafer 40 after the mounting process.

In embodiments, a coating layer 46 can also be optionally provided on a diamond side of the GaN-on-diamond wafer 40 to aid adhesion and/or to planarize the diamond surface and/or to allow release of the UV glue (adhesive 48) from the GaN-on-diamond wafer 40 after device processing on the GaN layer of the GaN-on-diamond wafer 40. In embodiments, the coating 46 may be formed of thermoplastic material. In embodiments, adhesive (such as UV glue) 48 may be provided over the GaN-on-diamond wafer 40 and a quartz carrier wafer 50 is positioned on the adhesive layer 48. A further quartz flat 52 is used to press the quartz carrier wafer 50 to the front-justified GaN-on-diamond wafer 40. A ring shaped silicon spacer wafer 54 is used to control the thickness of layered structure.

Figure 6:
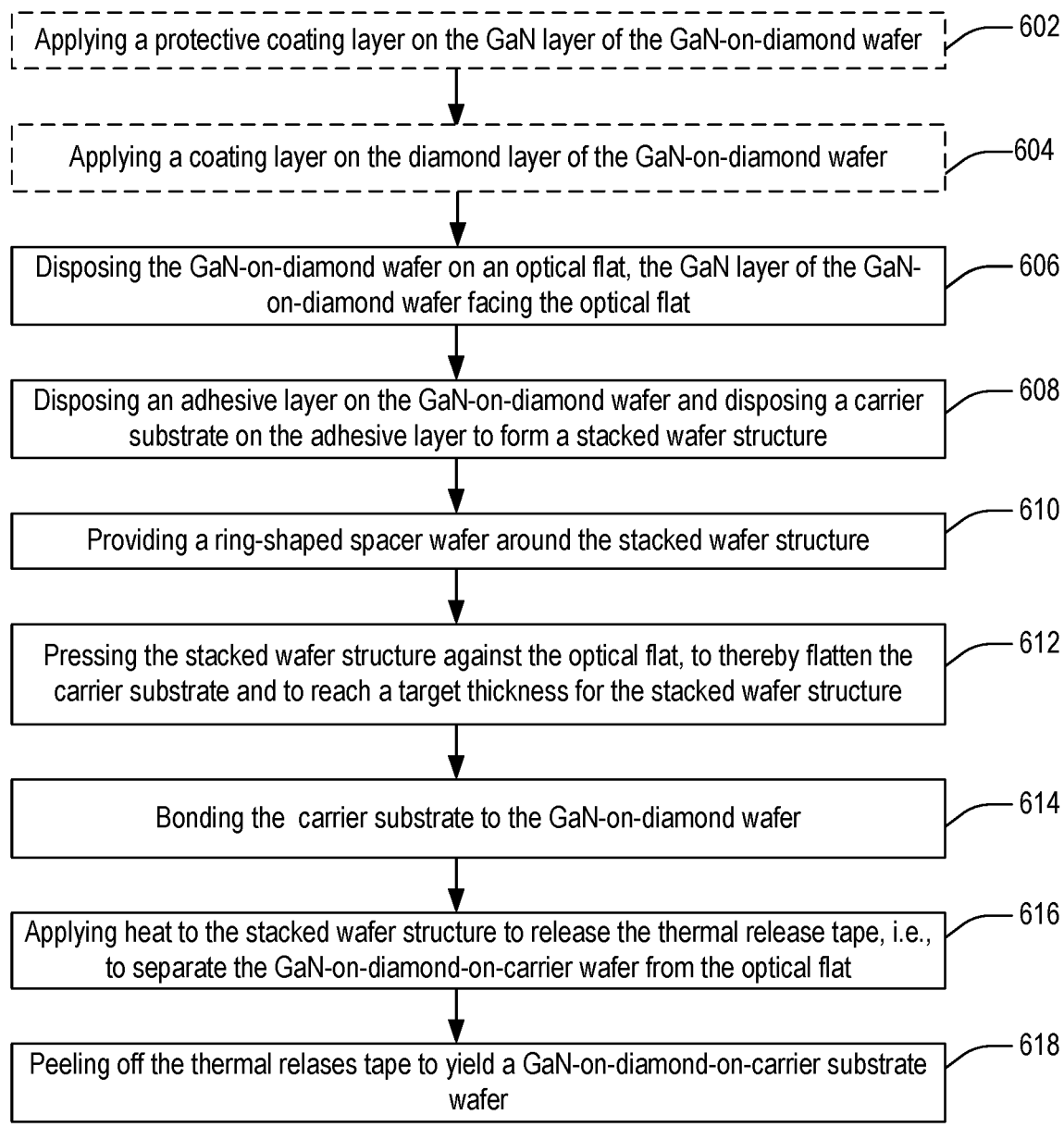
FIG. 6 illustrates a flowchart illustrating exemplary steps for mounting a GaN-on-Diamond wafer to a carrier wafer according to embodiments of the present invention.

FIG. 6 illustrates a flowchart 600 illustrating exemplary steps for mounting a GaN-on-diamond wafer to a carrier wafer according to embodiments of the present invention. The process begins at step 602.

At step 602, an optional protective coating 56 (e.g. SiN) may be disposed on the layer of GaN (or, equivalently, GaN side or semiconductor side) of the GaN-on-diamond wafer 40. In embodiments, the GaN-on-diamond wafer 40 includes a diamond layer and a semiconductor (or, equivalently, GaN) layer, where the semiconductor layer is on the bottom side in FIG. 4.

At step 604, optionally, a coating layer (or, shortly coating) 46 may be disposed on the diamond side of the GaN-on-diamond wafer 40, where the coating 46 may include thermoplastic material. As discussed below, the optional coating 46 may aid adhesion and/or to planarize the diamond surface and/or to allow release of the UV glue (adhesive 48) from the GaN-on-diamond wafer 40 after device processing on the GaN layer of the GaN-on-diamond wafer 40.

At step 606, the GaN-on-diamond wafer 40 may be disposed on the optical flat (such as quartz flat) 42, where the GaN layer faces the optical flat. In embodiments, a thermal release tape (such as 3195N Nitto™ tape, 90° C. release) 44 may be disposed between the GaN-on-diamond wafer 40 and the optical flat 42. Alternatively, a thermoplastic layer may be used in place of the thermal release tape 44, where the thermoplastic layer, such as brewer bond 305, may be spin coated on the GaN-on-diamond wafer 40 and baked to remove solvent.

At step 608, an adhesive layer 48 may be disposed on the GaN-on-diamond wafer 40 and a carrier substrate (such as quart substrate) 50 may be disposed on the adhesive layer 48, to thereby form a stacked wafer structure (or, shortly stacked structure) 53. In the stacked structure 53, the adhesive layer 48 is located between the carrier substrate 50 and the GaN-on-diamond wafer 40 (more specifically the diamond layer of the GaN-on-diamond wafer 40). In embodiments, the adhesive layer 48 may be formed of UV glue, where the UV glue may be spun onto the carrier substrate 50 (e.g. Norland™ 61 UV glue; 1500 RPM; 30 seconds).

At step 610, the carrier substrate 50 and the GaN-on-diamond wafer are aligned, edges of thermal tape 44 are cleaned, and a ring shaped silicon spacer wafer (or, shortly spacer) 54 may be provided around the stacked wafer structure 53.

At step 612, the stacked layer structure 53 including the carrier substrate 50 and GaN-on-diamond wafer 40 may be pressed against the optical flat 42 together using another flat (such as quartz flat) 52 in order to flatten the quartz carrier substrate 50 and reach the correct thickness for the stacked structure 53. During step 612, the GaN-on-diamond wafer 40 may be front justified to the optical flat 42 so that the bottom surface of the GaN layer of the GaN-on-diamond wafer 40 is flattened by the top surface of the optical flat 42.

In embodiments, at step 614, the GaN-on-diamond wafer 40 may be bonded to the carrier substrate 50. In embodiments, the stacked wafer structure 53 may be removed from the press and the adhesive layer 48 is cured so that the carrier substrate 50 is bonded to the GaN-on-diamond wafer 40. In embodiments, the adhesive 48 is formed of UV glue that may be cured by exposing the glue to UV light for 9 minutes. Alternatively, the stacked wafer structure 53 may remain in the press so that the adhesive layer 48 is cured while the stacked wafer structure 53 is being pressed against the optical flat 42. For instance, the flat 52 may be made of material that is transparent to UV light so that the UV light incident on the top surface of the flat 52 passes through both the flat 52 and the carrier substrate 50 and cures the UV glue to thereby bond the carrier substrate 50 to the GaN-on-diamond wafer 40. In embodiments, the temperature for curing the UV glue may be between 10° C. and 40° C.

At step 616, the stacked wafer structure 53 is baked at a temperature (such as 120° C.) to heat release the tape 44 so that the GaN-on-diamond-on-carrier wafer 55 is separated from the optical flat 42. Here, the GaN-on-diamond-on-carrier wafer 55 refers to the stack of GaN-on-diamond wafer 40, adhesive layer 48, and carrier substrate 50, and optically, one or more of the protective coating 56 and the coating 46. In embodiments, the thermal release tape 44 may be released at a temperature which does not cause softening of the adhesive layer 48.

At step 618, the tape is peeled off to yield the final GaN-on-diamond-on-carrier substrate wafer 55 (or, equivalently mounted wafer).

In embodiments, a mounted wafer of controlled thickness and having a bow and warp of less than 20 µm is achieved in a processing time of approximately 1 hour. Such a mounted wafer is suitable for semiconductor device processing. Furthermore, after device processing, the carrier substrate 50 can be released by heating the mounted wafer structure 55 at 250° C. for about 10 minutes. Dismounting the carrier substrate 50 by heating the mounted wafer, more specifically heating the adhesive 48, is a useful but not necessary condition of mounting. The ability to make a glue that can support temperatures of 200° C. but that dismounts at 250° C. is very useful. 200° C. allows for many fabrication processes, yet 250° C. is not a difficult temperature to achieve. This moderate temperature of dismount makes the process simple and easy to achieve. Other techniques such as sliding at elevated temperatures are also possible but they need to be set at room temperature. For this reason, an alternative embodiment would be to pre-coat the diamond and quartz with thermoplastic material so that the dismount leaves a clean quartz wafer, where the thermoplastic layer may be disposed between the carrier substrate 50 and the diamond side of the GaN-on-diamond wafer 40. In embodiments, the thermal tape 44 may be replaced by a thermoplastic layer, where the thermoplastic layer, such as brewer bond 305, is spin coated and baked up to 220° C. to remove solvents. It has been found that this approach provides a more repeatable approach compared with the use of a thermal release tape 44. Coating the diamond with a thermoplastic allows a slide release above 250° C.

While standard mounting techniques for back side processing rely on a constant thickness of the wafer to be processed and precise CTE matching between the thin wafer and the carrier (Si thin wafer and Si carrier wafer for example), in embodiments, CTE mismatched wafers are joined. In embodiments, a carrier substrate that is closely matched to diamond of the GaN-on-diamond wafer (or, shortly diamond) in thermal expansion coefficient is selected and adhere it to the diamond side of the GaN-on-diamond wafer at room temperature by a UV sensitive adhesive. In embodiments, the carrier substrate's CTE may be a close match to diamond but less than or equal to diamond in CTE. If the CTE of the carrier substrate is larger that of the diamond, during heating the diamond is under tension and is easily broken. Conversely, if the CTE of the carrier substrate is lower than the CTE of diamond, then when heated, the diamond is under compression and is much more stable.

In embodiments, by adhering with UV glue at room temperature, the mounting process is simple and the difference in CTE between the carrier substrate and the diamond does not lead to mechanical bowing of the diamond for the lithography steps. In embodiments, the adhesion may be performed at (or within a few degrees of) the temperature where lithography will occur so that the GaN-on-diamond remains flat. The UV glue which sets by UV exposure may be used to adhere the carrier substrate at the correct temperature. In embodiments, alternatives such as epoxies that set at room temperature may also be acceptable. In embodiments, UV glues are preferable because they can be re-worked for an extended amount of time then set when ready, as opposed to having a fixed amount of time before which the adhesive sets. Thermal setting adhesives may not be acceptable because they set at a temperature higher than lithography temperatures and unless the semiconductor-on-diamond CTE is exactly matched to the carrier then the wafer bows when cooled to lithography temperature.

In embodiments, the combination of a quartz carrier substrate and a low temperature UV adhesive for mounting the GaN-on-Diamond wafer is used in order to manage thermal mismatch problems and minimize wafer bow. In embodiments, another modification which can aid in achieving ultra-flat mounted GaN-on-Diamond wafers is to use a carrier substrate which comprises layers having differing coefficients of thermal expansion which are selected such that internal residual stresses ensure near zero bow. For example, the carrier substrate can comprise a layer having a higher coefficient of thermal expansion (CTE) than diamond (e.g. silicon) in addition to the layer having a lower coefficient of thermal expansion (CTE) than diamond (e.g. provided by the previously described quartz carrier wafer).

In embodiments, a carrier substrate is provided which comprises more than one layer of different materials such that the differences in CTE of these layers results in a mounted GaN-on-Diamond wafer with the required mechanical specifications in terms of thickness uniformity, bow, and warp. Furthermore, such specifications can be achieved at room temperature even following a high temperature bonding process if the layers are suitably selected. In embodiments, by selecting materials that have both higher (e.g. silicon) and lower (e.g. quartz) CTE than diamond and carefully choosing the thickness of each layer and their order within the wafer stack, on cooling to room temperature internal residual stresses ensure near zero bow.

In embodiments, the carrier substrate may thus include two or more layers, of which at least two layers must have a different CTE. At least one layer may have a CTE which is higher than that of diamond. In embodiments, the materials, thicknesses, and layer structure may be selected such that:

a. The diamond is either unstressed or in compression at all temperatures that the mounted carrier wafer will experience during subsequent device manufacture (typically between room temperature and 250° C.).
b. The stress in each constituent layer does not exceed the strength of that layer.
c. The system may be optimised for a particular bond temperature—the optimum materials and thicknesses may change if the wafer is bonded, for example, at 200° C. vs 300° C.

In light of the above, certain embodiments include a carrier substrate comprising a layer having a higher coefficient of thermal expansion (CTE) than diamond (e.g. silicon) in addition to the layer having a lower coefficient of thermal expansion (CTE) than diamond (e.g. quartz). Such a multilayer carrier substrate can be adhered to a semiconductor-on-diamond wafer using a polymer adhesive which is cured by heating. In embodiments, the adhesive can be provided between the carrier substrate and the diamond side of the semiconductor-on-diamond wafer and also between the layers of the carrier substrate. Furthermore, in embodiments, a thermal release adhesive can be provided between the carrier substrate and the diamond side of the semiconductor-on-diamond wafer to allow release of the carrier substrate after use. For example, a thermal release adhesive can be provided that is formed of a material which, after bonding, is releasable when exposed to temperatures in excess of 220° C. (or in excess of 250° C. or more depending on the temperature of device fabrication process) to enable the carrier substrate to be removed and re-used after semiconductor device fabrication on the semiconductor-on-diamond wafer.

Figure 5:
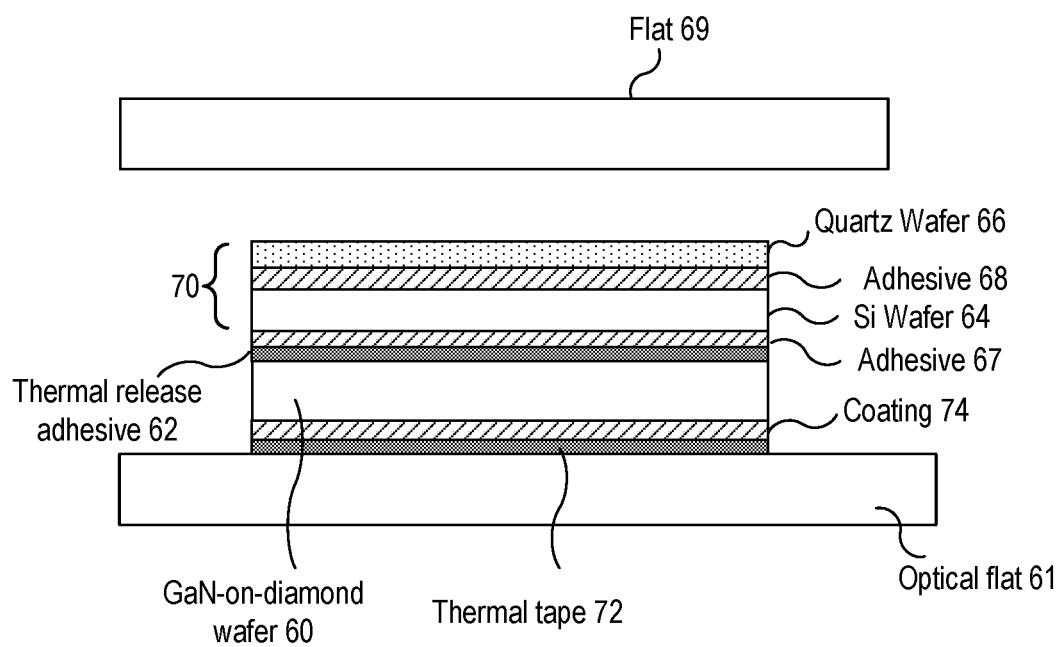
FIG. 5 illustrates another suitable mounting configuration for bonding a carrier substrate to a GaN-on-diamond wafer using a multi-layer carrier substrate according to embodiments of the present invention.

FIG. 5 shows a configuration for bonding a multi-layer carrier substrate to a GaN-on-Diamond wafer according to embodiments of the present invention. As depicted, the layer structure of the GaN-on-diamond-on carrier substrate wafer in FIG. 5 is similar to that in FIG. 4, with the difference that the carrier substrate 70 may include at least two layers: one layer 64 having a higher coefficient of thermal expansion (CTE) than diamond (e.g., silicon) and another layer 66 having a lower CTE than diamond (e.g., quartz). The GaNon-diamond-on carrier substrate wafer in FIG. 5 may also include: an adhesive layer 68 that is disposed between the two layers 64 and 66, and a thermal release adhesive 62. In embodiments, the adhesive layer 67, which bonds the carrier substrate 70 to the GaN-on-diamond wafer 60, may be similar to the adhesive layer 48 in FIG. 4.

It is noted that the protective coating 74 and thermal release tape 72 are optional and similar to their counterparts 56 and 44, respectively. Likewise, a ring-shaped spacer wafer (not shown in FIG. 5), which is similar to the ring-shaped spacer wafer 54 may be disposed around the GaN-on-diamond wafer 60 and the carrier substrate 70 before the flat (such as optical flat) 69 presses the GaN-on-diamond wafer 60 and the carrier substrate 70 against the optical flat 61.

It is also noted that the steps for the mounting of the carrier substrate 70 to the GaN-on-diamond wafer 60 are similar to the steps in flowchart 600 in FIG. 6. For instance, in embodiments, a GaN-on-Diamond wafer 60 (approximately 120 μm thickness) is pressed against an optical flat 61. In embodiments, the thermal release adhesive 62 is optionally provided on the diamond side of the GaN-on-Diamond wafer 60. In embodiments, the carrier substrate 70 may include a wafer of silicon 64 (approximately 295 μm thickness) and a wafer of quartz 66 (approximately 152 μm thickness) bonded to the wafer of silicon 64 by a high temperature polymer adhesive 68. The carrier substrate 70 may be attached to the GaN-on-Diamond wafer 60 using a high temperature polymer adhesive 67 (bonding temperature 350° C.), where the adhesive 67 may be formed of the same material as the adhesive 68. In embodiments, the high temperature polymer adhesive layers 67 and 68 are spun on, the bonding process occurs at 350° C., and a further optical flat 69 is used to apply a pressure of approximately 1000 N during bonding. The bonding also advantageously takes place under vacuum to aid air pocket removal in the adhesive layers 67 and 68.

A stress model has been developed to help design the carrier substrate. Currently the design outlined in FIG. 5 is deemed advantageous due to:
  a. readily available wafer materials for the carrier substrate (e.g. quartz and silicon) which are cheaper than a thermally matched diamond carrier substrate;
  b. it has been demonstrated that the wafers can be ground to the required thickness i.e. the wafers are not required to be too thin to handle; and
  c. the bow at room temperature for this design is within specification.

The stress in the diamond for the proposed structure is such that the diamond layer is in compression (-ve stress) through the entire thickness of the layer. The silicon layer 64 is entirely in tension at a level below its tensile strength (>200 MPa).

The modeling suggests that bowing is highly sensitive to carrier wafer layer thicknesses and thus a high degree of precision in terms of grinding wafers to a desired thickness is required for any given design. For example, in the configuration illustrated in FIG. 5 and described above, a 12 μm decrease in quartz wafer thickness leads to bowing increase outside required specifications. The sensitivity of the system to layer thicknesses and also thermal stresses can be reduced by using materials with more closely matched CTE to that of diamond. However, access to cheap and available wafer materials meeting this requirement is limited for commercial applications. Furthermore, it should be noted that the specific combination of wafer thicknesses will be dependent on the combination of materials used, the thickness of the GaN-on-Diamond wafer, and the bonding temperature. It has been demonstrated here that this multi-layer carrier substrate approach is viable and given these teachings variations on the approach can readily be designed for specific embodiments and applications.

The methodology as described herein is capable of fabricating a semiconductor-on-diamond-on-carrier substrate wafer comprising:
  a semiconductor-on-diamond wafer; and
  a carrier substrate bonded to a diamond side of the semiconductor-on-diamond wafer,
  wherein the carrier substrate comprises at least one layer having a lower coefficient of thermal expansion (CTE) than diamond,
  wherein the carrier substrate is bonded to the diamond side of the semiconductor-on-diamond wafer with an adhesive, and
  wherein the bonded semiconductor-on-diamond-on-carrier substrate wafer has the following characteristics:
    a total thickness variation of no more than 40 μm, and more preferably no more than 30 μm, 20 μm, or 10 μm;
    a wafer bow of no more than 100 μm, and more preferably no more than 80 μm, 60 μm, 40 μm or 20 μm;
    a wafer warp of no more than 40 μm, and more preferably no more than 20 μm.

In embodiments, the carrier substrate (50, 70) may be formed of a single layer of material having a lower coefficient of thermal expansion (CTE) than diamond (e.g. quartz) or alternatively may comprise more than one layer including a layer having a higher coefficient of thermal expansion (CTE) than diamond (e.g. silicon) in addition to the layer having a lower coefficient of thermal expansion (CTE) than diamond. Furthermore, the semiconductor-on-diamond-on-carrier substrate wafer structure may also include a thermal release adhesive 62 between the carrier substrate 70 and the diamond side of the semiconductor-on-diamond wafer 60 to allow release of the carrier substrate 70 after use.

The presently described methodology is capable of achieving the requirements for total thickness variation, wafer bow, and wafer warp over a diameter of at least 50 mm, 75 mm, 100 mm, or 150 mm. In this regard, it will be noted that with increasing wafer diameter it becomes increasing difficult to retain a flat geometry but many applications require large diameter (and large area) wafers. As such, it is an important feature of embodiments of the present invention that a flat geometry is achieved even for large area wafers. Typical dimensions for the semiconductor-on-diamond-on-carrier substrate wafer are as follows: a wafer thickness in a range 200 μm to 1 mm; a diameter in a range 40 mm to 200 mm; a semiconductor-on-diamond wafer thickness in a range 50 μm to 300 μm.

While this invention has been particularly shown and described with reference to embodiments, it will be understood to those skilled in the art that various changes in form and detail may be made without departing from the scope of the invention as defined by the appending claims. It will be appreciated to those skilled in the art that the preceding examples and embodiment are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

The invention claimed is:

1. A method of mounting a semiconductor-on-diamond wafer on a carrier substrate, the method comprising:

disposing a semiconductor-on-diamond wafer on an optical flat, the semiconductor-on-diamond wafer including a diamond layer and a semiconductor layer and arranged so that the semiconductor layer faces the optical flat;

disposing a coating layer on the diamond layer of the semiconductor-on-diamond wafer, the coating layer being formed of thermoplastic material;

disposing an adhesive layer on the coating layer of the semiconductor-on-diamond wafer;

disposing a carrier substrate on the adhesive layer, the carrier substrate including a layer having a lower coefficient of thermal expansion (CTE) than diamond and a layer having a higher coefficient of thermal expansion (CTE) than diamond;

pressing the carrier substrate against the optical flat and bonding the carrier substrate to the semiconductor-on-diamond wafer to form a semiconductor-on-diamond-on carrier substrate wafer while the carrier substrate is pressed against the optical flat; and separating the semiconductor-on-diamond-on-carrier substrate wafer from the optical flat.

2. A method according to claim 1, wherein, after the step of separating the semiconductor-on-diamond-on-carrier substrate wafer from the optical flat, the semiconductor-on-diamond-on-carrier substrate wafer has the following characteristics:
a total thickness variation of no more than 40 µm;
a wafer bow of no more than 100 µm; and
a wafer warp of no more than 40 µm.

3. A method according to claim 1, wherein the step of bonding includes curing the adhesive layer at a temperature between 10° C. and 40° C.

4. A method according to claim 1, wherein the adhesive layer includes a UV glue that is cured when exposed to UV light and the step of bonding includes exposing UV light to the adhesive layer.

5. A method according to claim 4, wherein the step of pressing the carrier substrate against the optical flat includes:
mounting an additional flat on the carrier substrate; and
pressing the additional flat against the carrier substrate.

6. A method according to claim 5, wherein the additional flat is formed of material that is transparent to the UV light.

7. A method according to claim 1, wherein the adhesive includes a thermal release adhesive material, further comprising:

heating the thermal release adhesive material to thereby release the carrier substrate from the semiconductor-on-diamond wafer.

8. A method according to claim 1, wherein the adhesive includes a polymer adhesive material and the step of boding includes curing the adhesive by heating.

9. A method according to claim 1, wherein the layer having a lower CTE than diamond is formed of quartz.

10. A method according to claim 1, wherein the layer having a higher CTE than diamond is formed of silicon.

11. A method according to claim 1, wherein an adhesive layer is provided between the layer having a lower CTE than diamond and the layer having a higher CTE than diamond.

12. A method according to claim 1, further comprising:
disposing a thermal release tape between the semiconductor layer of the semiconductor-on-diamond wafer and the optical flat.

13. A method according to claim 1, further comprising:
disposing a protective coating layer on the semiconductor layer of the semiconductor-on-diamond wafer.

14. A method according to claim 1, further comprising:
disposing a thermal release adhesive layer between the carrier substrate and the semiconductor-on-diamond wafer.

15. A method of fabricating semiconductor device structures, comprising:
fabricating one or more semiconductor device structures on the semiconductor layer of the semiconductor-on-diamond-on-carrier substrate wafer formed according the method of claim 1 while maintaining the semiconductor-on-diamond-on-carrier substrate wafer at a device fabrication temperature at which bonding of the carrier substrate and semiconductor-on-diamond wafer is maintained; and releasing the carrier substrate from the semiconductor-on-diamond wafer after fabrication of the one or more semiconductor device structures by heating the semiconductor-on-diamond-on-carrier substrate wafer to a temperature in excess of the device fabrication temperature such that bonding of the carrier substrate and semiconductor-on-diamond wafer is broken.

16. A method according to claim 1, further comprising:
disposing a coating layer formed of thermoplastic material between the semiconductor layer of the semiconductor-on-diamond wafer and the optical flat.

\* \* \* \* \*